(12) United States Patent
Bleeker et al.

(10) Patent No.: US 7,508,494 B2
(45) Date of Patent: Mar. 24, 2009

(54) LITHOGRAPHIC APPARATUS AND A SUBTRATE TABLE FOR EXCITING A SHOCKWAVE IN A SUBSTRATE

(75) Inventors: Arno Jan Bleeker, Westerhoven (NL); Dominicus Jacobus Petrus Adrianus Franken, Veldhoven (NL); Johannes Hendrikus Gertrudis Franssen, Eersel (NL); Johannes Theodorus Guillielmus Maria Van De Ven, Eindhoven (NL); Michiel Puyt, Veldhoven (NL); Teun Peterus Adrianus De Wilt, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 11/643,952

(22) Filed: Dec. 22, 2006

(65) Prior Publication Data

US 2008/0151212 A1  Jun. 26, 2008

(51) Int. Cl.
*G03B 27/58* (2006.01)
*G03B 27/42* (2006.01)

(52) U.S. Cl. .......................... 355/72; 355/53
(58) Field of Classification Search .................. 355/72, 355/53; 118/663; 361/234; 438/462, 710; 134/1; 250/440.11
See application file for complete search history.

(56) References Cited

U.S. PATENT DOCUMENTS

| | | | |
|---|---|---|---|
| 5,155,523 A * | 10/1992 | Hara et al. | 355/53 |
| 5,325,261 A | 6/1994 | Horwitz | 361/234 |
| 5,459,632 A | 10/1995 | Birang et al. | |
| 5,612,850 A | 3/1997 | Birang et al. | |
| 5,790,365 A | 8/1998 | Shel | 361/234 |
| 6,033,484 A * | 3/2000 | Mahoney | 134/1 |
| 6,403,322 B1 | 6/2002 | Fischer | 435/6 |
| 6,897,945 B1 | 5/2005 | Ottens et al. | 355/72 |
| 2003/0001103 A1* | 1/2003 | Kobayashi et al. | 250/440.11 |
| 2003/0040193 A1* | 2/2003 | Bailey et al. | 438/710 |
| 2004/0182311 A1 | 9/2004 | Hanazaki | 118/663 |
| 2005/0083634 A1* | 4/2005 | Breitschwerdt et al. | 361/234 |
| 2006/0003553 A1* | 1/2006 | Park et al. | 438/462 |
| 2006/0017893 A1 | 1/2006 | Mertens et al. | |

FOREIGN PATENT DOCUMENTS

EP  0 700 593 B1  6/1999
JP  2-159744  6/1990

OTHER PUBLICATIONS

International Search Report for Appln. No. PCT/NL2007/050663 mailed Apr. 16, 2008, 2 pgs.

* cited by examiner

*Primary Examiner*—Peter B Kim
(74) *Attorney, Agent, or Firm*—Sterne, Kessler, Goldstein & Fox P.L.L.C.

(57) ABSTRACT

A lithographic apparatus includes an illumination system constructed and arranged to condition a radiation beam, and a support constructed and arranged to support a patterning device. The patterning device is capable of imparting the radiation beam with a pattern in its cross-section to form a patterned radiation beam. The apparatus also includes a substrate table constructed and arranged to hold a substrate, and a projection system constructed and arranged to project the patterned radiation beam onto a target portion of the substrate. The substrate table includes a plurality of projections constructed and arranged to support corresponding parts of a bottom section of the substrate, and an actuator constructed and arranged to excite a shockwave in the substrate.

22 Claims, 3 Drawing Sheets

LITHOGRAPHIC APPARATUS AND A SUBTRATE TABLE FOR EXCITING A SHOCKWAVE IN A SUBSTRATE

FIELD

The present invention relates to a lithographic apparatus, a substrate table, and a method for releasing a wafer from a substrate table.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

During operation in a lithographic apparatus, a substrate is clamped to a substrate table that includes a supporting device, such as a vacuum chuck, which is provided with a number of burls for supporting corresponding parts of a bottom section of the substrate. In order to strive to optimal fixation during a lithographic process, which is very position sensitive, the chuck is provided with a clamping device, such as an electrostatic clamp or a vacuum system.

After the lithographic process is finished, the substrate is released from the substrate table for further processing in a different stage of the lithographic process. Due to the activation of the clamping device, the substrate tends to stick to the substrate table even though the clamping device has been de-activated. This sticking effect is generally due to adhesion forces between the bottom section of the substrate and the top section of the supporting burls, as well as to electrostatic forces generated by residual electrostatic charges. Adhesion forces may be generated by material impurities, and roughness imperfectness of the contacting surfaces.

Techniques to counteract the undesired sticking effect may include providing a pressurized gas between the bottom section of the substrate and the top section of the supporting device. However, this method may not provide reliable results and may cause damage to the substrate and/or burls of the substrate table. Substrates may slip over the burls, thereby causing wear on the burls, which may lead to additional sticking forces and fixation performance degradation. In the process of loading a substrate on a sticky burl, overlay and contamination degradation may occur, because horizontal movement of the substrate may be hindered.

Further, JP 2159744 discloses a mechanism for asymmetrically lifting a substrate from the substrate table by means of a substantially centrally located knock-out pin, and a swing cam positioned near a peripheral edge of the substrate. The lifting structure aims at peeling the substrate from the substrate table. However, during this peeling process, breakage of the substrate might occur, thereby leading to an undesired reduction in the production yield of substrates.

SUMMARY

It is desirable to provide a more reliable substrate table for releasing a wafer from a substrate table in a lithographic apparatus.

According to an aspect of the invention, there is provided a lithographic apparatus that includes an illumination system constructed and arranged to condition a radiation beam, and a support constructed and arranged to support a patterning device. The patterning device is capable of imparting the radiation beam with a pattern in its cross-section to form a patterned radiation beam. The apparatus also includes a substrate table constructed and arranged to hold a substrate, and a projection system constructed and arranged to project the patterned radiation beam onto a target portion of the substrate. The substrate table includes a plurality of projections constructed and arranged to support corresponding parts of a bottom section of the substrate, and an actuator constructed and arranged to excite a shockwave in the substrate. According to an aspect of the invention, there is provided a substrate table for supporting a substrate in a lithographic apparatus, comprising a multiple number of burls for supporting corresponding parts of a bottom section of the substrate, further comprising an actuator for exciting a shockwave in the substrate.

According to an aspect of the invention, there is provided a plurality of projections constructed and arranged to support corresponding parts of a bottom section of the substrate, and an actuator constructed and arranged to excite a shockwave in the substrate.

According to an aspect of the invention, there is provided a method for releasing a substrate from a substrate table in a lithographic apparatus. The method includes exciting a shockwave in the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
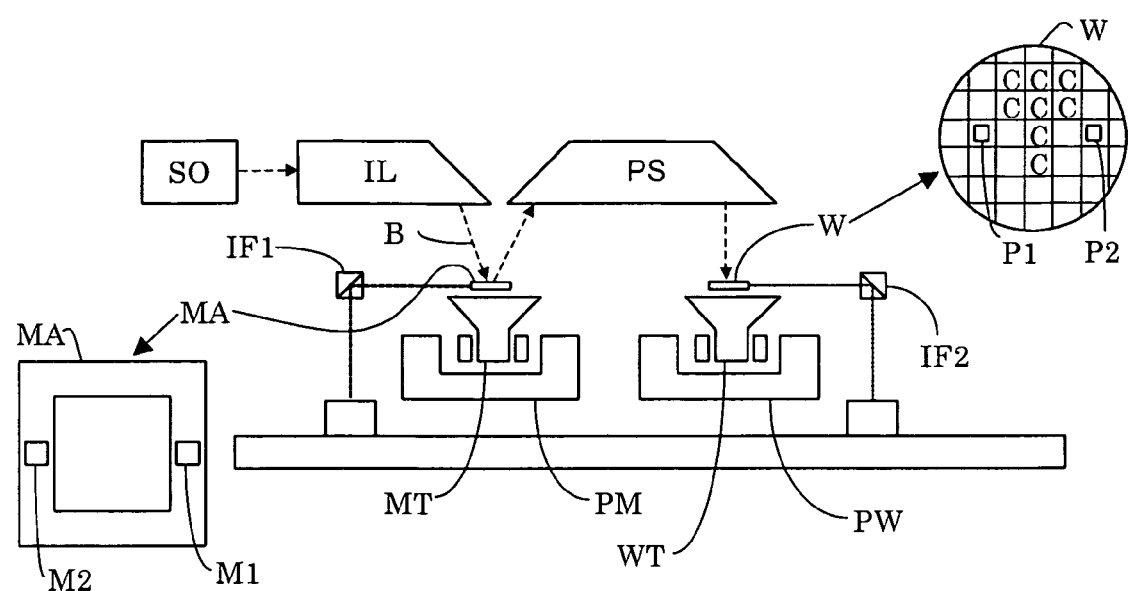
FIG. 1 depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B (e.g. UV radiation or visible light radiation); a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus, for example when the source is a mercury lamp. The source SO and the illuminator IL, together with the beam delivery system if needed, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
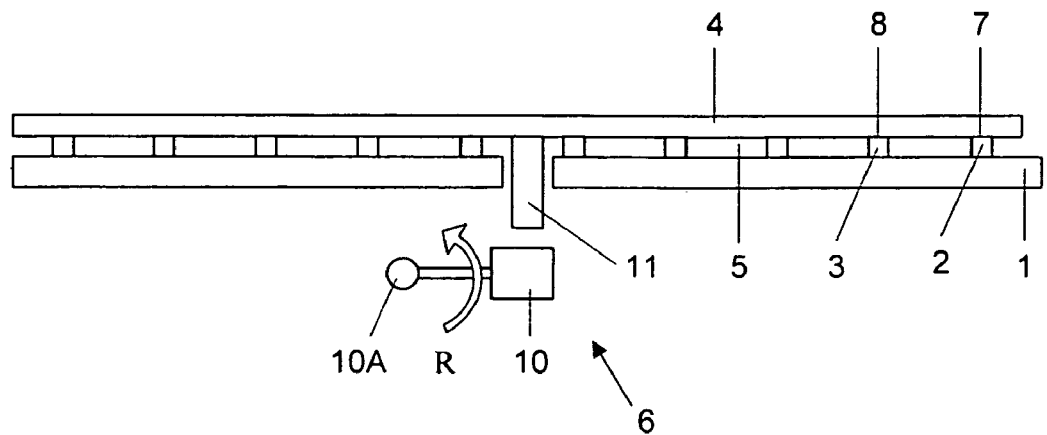
FIG. 2 depicts a substrate table according to a first embodiment of the invention.

FIG. 2 depicts a substrate table 1 for a lithographic apparatus according to an embodiment of the invention. The substrate table 1 comprises a vacuum chuck having a plurality of projections, which in one embodiment may take the form of burls 2, 3 for supporting a substrate 4, such as a wafer. In particular, during operation of a lithographic process, upper surfaces of the burls contact corresponding contacting parts 7, 8 of a bottom surface of the substrate 4 and exert a static upwardly oriented force to the contacting parts 7, 8. To ensure fixation during the process, one or more cavities 5 that are formed by the spaces between the burls 2, 3 and the lower surface of the substrate 4 are subjected to a vacuum, preferably a high vacuum. As an alternative, electrostatic forces can be used to fix the substrate 4 to the substrate table 1.

Once the substrate 4 is fixed to the burls 2, 3, a lithographic process can be carried out. After the lithographic process stops, the substrate is to be removed to another location. Therefore, the vacuum in the one or more cavities 5 is terminated. Remaining bonding forces, such as adhesion forces, also known as Van der Waals forces, and electrostatic forces may cause the substrate 4 to still stick to the burls 2, 3 of the substrate table 1.

The substrate table 1 comprises an actuator for exciting a shockwave in the substrate 4. By activating the actuator 6 to excite a shockwave in the substrate 4, vibration energy may be coupled into the substrate, in particular into the bottom section of the substrate. Then, the bottom section of the substrate 4, including the contacting parts 7, 8, tends to vibrate, which may advantageously break a remaining contact force between the contacting parts 7, 8 and upper surfaces of the burls 2, 3. The substrate 4 can then be removed from the substrate table 1 and transported to another part of the lithographic apparatus for further processing. As an example, the substrate 4 can be lifted by a substrate lifting actuator, called e-pins 9, e.g. shown in FIG. 3, comprised by the substrate table 1 and can be taken away by a transporting device.

The actuator is implemented as a device for inducing a pre-determined mechanical pulse to the substrate 4. In an embodiment, illustrated in FIG. 2, the substrate table 1 includes an actuator 6 that comprises a moving element 10 and a block 11 contacting a bottom surface of the substrate 4. The moving element is implemented as a swinging element 10 that swivels with respect to an axis 10A into a swivel direction R from an offset state to a state in which it contacts the block 11 for transferring vibration energy to the surface to excite the shockwave. As will be appreciated by the person skilled in the art, many other moving elements or actuators can be constructed to excite a shockwave in the substrate 4, such as a moving element that is arranged to perform a translation, a cam shaft construction, a vibrating object, a solenoid or a piezoelectric device. The illustrated embodiments are not intended to be limiting in any way.

The pre-determined pulse comprises a force having a pre-determined temporal characteristic so as to optimize breakage of remaining bonding forces between the substrate 4 and the substrate table 1 by providing an impulse to the substrate 4, and simultaneously reducing the chance that the substrate 4 itself breaks or that its surface gets damaged or chipped. The actuator is arranged to induce a single mechanical pulse or to induce a number of repeating pulses, either periodically or quasi-periodically. Further, the e-pins 9, e.g. shown in FIG. 3, can be lifted directly upon exciting the shockwave to assist in removing the substrate 4 from the table 4.

In an alternative embodiment, the e-pins 9 are lifted until they contact the substrate 4. Then, the shockwave is excited by the actuator so that the e-pins can immediately exert a pushing force.

Preferably, the actuator contacts the substrate 4 directly. However, in principle, the actuator might be arranged such that one or more burls are contacted for indirectly exciting the shock wave in the substrate.

Figure 3:
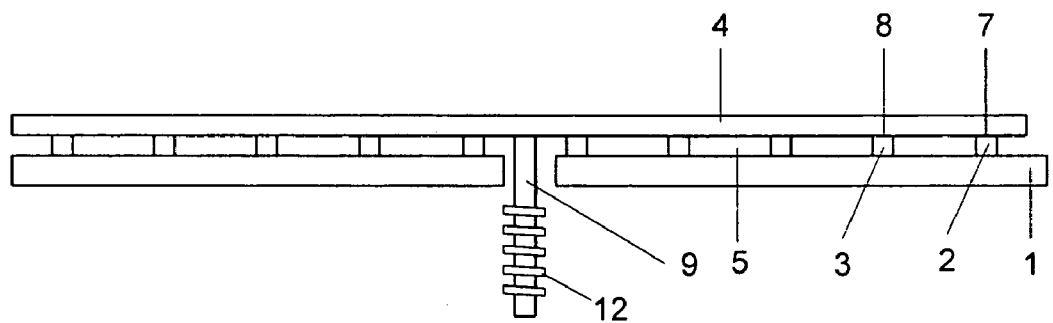
FIG. 3 depicts a substrate table according to a second embodiment of the invention.
Figure 4:
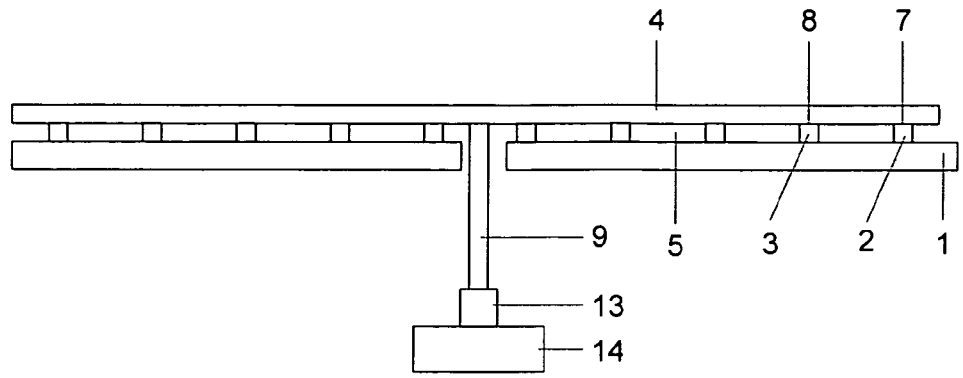
FIG. 4 depicts a substrate table according to a third embodiment of the invention.

FIGS. 3 and 4 show embodiments in which the shockwave in the substrate 4 is excited via an e-pin 9. Movement of the e-pin is induced magnetically using a coil 12 and using a piezo actuator 13 fixed to a mass 14, respectively. In particular, the piezo actuator 13 may be used to induce a number of repeating pulses, either periodically or quasi-periodically. In the embodiments shown in FIGS. 3 and 4, the actuator is integrated with the substrate lifting actuator 9. In the embodiments shown in FIGS. 2 and 5, the actuator is implemented separately.

Figure 5:
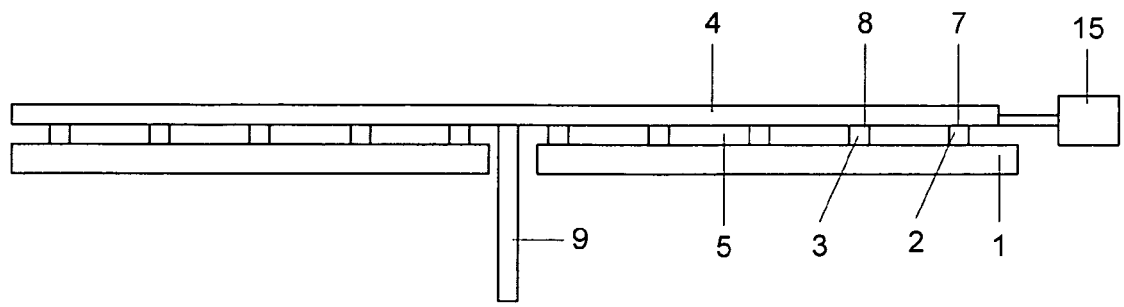
FIG. 5 depicts a substrate table according to a fourth embodiment of the invention.

FIG. 5 shows an embodiment in which an actuator 15 for exciting a shockwave in the substrate contacts a side surface of the substrate 4. The actuator 15 can be driven mechanically, magnetically, or via a piezo force. However, other mechanisms can be used for exciting the shockwave, e.g. using an electrostatic or pneumatic force.

Further, the moving element 10 in FIG. 2 has a contact area having a shape that is specifically designed for reproducing the pre-determined push, so that a reliable actuator is obtained for breaking the remaining bonding forces between the substrate 4 and the substrate table 1 without breaking the substrate 4. It is noted that the device can also be provided with a less dedicated shape and/or be driven by a pre-determined force, thereby also aiming at a reliable actuator. The driving force may be formed by a mechanical structure such as a rotating element cooperating with a driving rod to be hit by the rotating element having a pre-determined rotating speed, or by a dynamic gas pressure.

In order to reduce damage, the contact area between the block 11 and the moving element 10 of the actuator may optionally be covered with a compliant material, such as an elastic synthetic material, thereby substantially uniformly spreading the impulse over the contact area of the moving element 10 and the substrate 4.

As indicated above, the actuator can be arranged to exert a substantially upwardly oriented force to the substrate 4 in order to exceed bonding forces between the substrate 4 and the upper surface of the burls 2, 3. However, in principle, the force might also be directed in another direction, e.g. in a substantially horizontal direction, as provided by the actuator 15 shown in FIG. 5.

Preferably, the pulse that is induced by the actuator comprises high frequency components to efficiently excite the shock wave in the substrate.

Further, it is noted that the substrate table 1 according to the invention is not merely suited for application in a lithographic apparatus, but may also be used in other devices, such as in an implanter or etching device.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system constructed and arranged to condition a radiation beam;
   a support constructed and arranged to support a patterning device, the patterning device being capable of imparting the radiation beam with a pattern in its cross-section to form a patterned radiation beam;
   a substrate table constructed and arranged to hold a substrate; and
   a projection system constructed and arranged to project the patterned radiation beam onto a target portion of the substrate,
   the substrate table comprising a plurality of projections constructed and arranged to to support corresponding parts of a bottom section of the substrate, and an actuator constructed and arranged to excite a shockwave in the substrate.

2. A lithographic apparatus according to claim 1, wherein the actuator is constructed and arranged to exert a pre-determined push on the substrate.

3. A lithographic apparatus according to claim 1, wherein the actuator comprises a part that is constructed and arranged to move periodically or quasi periodically.

4. A lithographic apparatus according to claim 1, wherein the actuator is constructed and arranged to contact the substrate directly.

5. A lithographic apparatus according to claim 1, wherein the actuator is constructed and arranged to exert a substantially upwardly oriented force to the substrate.

6. A lithographic apparatus according to claim 1, wherein the actuator comprises a contact area constructed and arranged to exert an impinging force in the substrate, and wherein the contact area is covered with a compliant material.

7. A lithographic apparatus according to claim 6, wherein the contact area of the actuator has a shape designed for reproducing a pre-determined push.

8. A lithographic apparatus according to claim 1, wherein the actuator is driven by a mechanical, electrical, magnetic, electrostatic, or piezo force and/or by gas pressure.

9. A lithographic apparatus according to claim 1, wherein the actuator is integrated with a substrate lifting actuator.

10. A lithographic apparatus according to claim 1, wherein the projections comprise burls.

11. A lithographic apparatus according to claim 1, wherein the shockwave excited by the actuator is configured to break a bonding force between the substrate and the substrate table.

12. A lithographic apparatus according to claim 11, wherein the bonding force is residual force that bonds the substrate to the substrate table after ceasing to exert a clamping force that is configured to clamp the substrate to the substrate table during substrate exposure.

13. A substrate table for supporting a substrate in a lithographic apparatus, the substrate table comprising:

a plurality of projections constructed and arranged to support corresponding parts of a bottom section of the substrate; and an actuator constructed and arranged to excite a shockwave in the substrate.

14. A substrate table according to claim 13, wherein the actuator is constructed and arranged to exert a pre-determined push on the substrate.

15. A substrate table according to claim 13, wherein the actuator comprises a part that is constructed and arranged to move periodically or quasi periodically.

16. A substrate table according to claim 13, wherein the actuator is constructed and arranged to contact the substrate directly.

17. A substrate table according to claim 13, wherein the actuator is constructed and arranged to exert a substantially upwardly oriented force to the substrate.

18. A substrate table according to claim 13, wherein the actuator comprises a contact area constructed and arranged to exert an impinging force on the substrate, and wherein the contact area is covered with a compliant material.

19. A substrate table according to claim 18, wherein the contact area of the actuator has a shape designed for reproducing a pre-determined push.

20. A substrate table according to claim 13, wherein the actuator is driven by a mechanical, electrical, magnetic, electrostatic, or piezo force and/or by gas pressure.

21. A substrate table according to claim 13, wherein the actuator is integrated with a substrate lifting actuator.

22. A substrate table according to claim 13, wherein the projections comprise burls.

* * * * *